United States Patent [19]

Humpston et al.

[11] Patent Number: 5,073,210

[45] Date of Patent: Dec. 17, 1991

[54] METHOD OF MAKING ELECTRICAL CONDUCTORS

[75] Inventors: Giles Humpston, Herts; David M. Jacobson, Middlesex, both of United Kingdom

[73] Assignee: The General Electric Company, p.l.c., England

[21] Appl. No.: 527,050

[22] Filed: May 22, 1990

[30] Foreign Application Priority Data

May 26, 1989 [GB] United Kingdom ................. 8912138

[51] Int. Cl.$^5$ .......................... C22F 1/02; C22C 5/02
[52] U.S. Cl. ................................ 148/11.5 R; 148/430
[58] Field of Search ........................... 148/11.5 R, 430

[56] References Cited

U.S. PATENT DOCUMENTS

| | | | |
|---|---|---|---|
| 3,922,180 | 11/1975 | Fuchs et al. .................... | 148/11.5 R |
| 4,387,073 | 6/1983 | Westbrook .......................... | 420/507 |
| 4,529,667 | 7/1985 | Shiga et al. ......................... | 428/646 |
| 4,911,769 | 3/1990 | Yamada et al. ..................... | 148/430 |

FOREIGN PATENT DOCUMENTS

| | | |
|---|---|---|
| 0178481 | 4/1986 | European Pat. Off. . |
| 0190648 | 8/1986 | European Pat. Off. . |
| 3716106 | 1/1989 | Fed. Rep. of Germany . |
| 60-85546 | 5/1985 | Japan . |
| 60-150657 | 8/1985 | Japan . |
| 1110045 | 4/1968 | United Kingdom . |
| 1149597 | 4/1969 | United Kingdom . |
| 1491155 | 11/1977 | United Kingdom . |

OTHER PUBLICATIONS

Haeussler et al., "Preparation and case hardening of dispersion hardened copper alloys", Technik, vol. 28, No. 10, 1973, pp. 622–627, Chemical Abstracts #80(14):73373k.

"Binary alloy phase diagrams Ac-Au to Fe-Rh", by T. B. Massalski appearing in American Society for Metals, vol. 1, 1988, pp. 326, 340, 310, 266 and 277.

Article entitled "The development of 990 Gold-Titanium: its production, use and properties", by G. Gafner in Gold Bulletin, 1989, 22(4), pp. 112–122.

Article entitled "The promise of 990 gold", by A. M. Tasker in Aurum 34, pp. 62–67.

Article entitled "Dispersion Hardened Gold", by Poniatowski et al., in Gold Bulletin, 1972, 5, p. 34.

*Primary Examiner*—H. Dean
*Assistant Examiner*—David W. Schumaker
*Attorney, Agent, or Firm*—Kirschstein, Ottinger, Israel & Schiffemiller

[57] ABSTRACT

A method of making material in the form of a fine wire or thin strip or sheet suitable for use as electrical conductors comprises: forming an ingot substantially consisting of an alloy of gold and one or more of the metals titanium, lutetium, zirconium, scandium and hafnium, the amount of the or each of said one or more of the metals in the alloy lying in the range from substantially 0.1 at % to an upper limit comprising the atomic percentage of that metal corresponding to the maximum solubility of that metal in the alloy; solution heat treating the ingot and then quenching the ingot from the solution heat treatment temperature; mechanically working the ingot to have a maximum dimension in at least one direction of not greater than 250 $\mu$m; and heat treating the resulting material at a temperature below its solvus temperature from an ambient atmosphere containing oxygen and/or nitrogen in the ambient atmosphere. The conductors exhibit high tensile strength and resistance to elongation under load and retention of such properties after being heated to elevated temperatures for extended periods of time, such as to render them particularly suitable for use as bond-wires in integrated circuit packages.

11 Claims, No Drawings

METHOD OF MAKING ELECTRICAL CONDUCTORS

BACKGROUND OF THE INVENTION

1. Field of the Invention

This invention relates to methods of making electrical conductors.

More precisely, the invention relates to electrical conductors, and methods of making material in the form of fine wire or thin strip or sheet, suitable for use as electrical conductors in electronic circuits e.g. when in the form of wires, for use as bond-wires in integrated circuit packages.

2. Description of Related Art

Such conductors are required to exhibit high tensile strength and resistance to elongation under load and retention of such properties after being heated to elevated temperatures for extended periods of time. These properties are required in order that such conductors may have good resistance to deformation and breakage under vibration, thermal fatigue and mechanical shock, during and after manufacture of the circuits in which they are employed. It will be understood in this connection that the manufacture of electronic circuits, more especially integrated circuits, normally involves heat treatments.

SUMMARY OF THE INVENTION

It is an object of the present invention to provide a method of making materials as aforesaid which exhibit superior performance in the above mentioned respects compared with materials made using known methods.

According to the present invention there is provided a method of making material in the form of fine wire or thin strip or sheet suitable for use as electrical conductors comprising: forming an ingot substantially consisting of an alloy of gold and one or more of the metals titanium, lutetium, zirconium, scandium and hafnium, the amount of the or each of said one or more of the metals in the alloy lying in the range from substantially 0.1 at% to an upper limit comprising the atomic percentage of that metal corresponding to the maximum solubility of that metal in the alloy; solution heat treating the ingot and then quenching the ingot from the solution heat treatment temperature; mechanically working the ingot to have a maximum dimension in at least one direction not greater than 250 $\mu$m; and heat treating the resulting material at a temperature below its solvus temperature in an ambient atmosphere containing oxygen and/or nitrogen to produce a reaction product precipitate with the oxygen and/or nitrogen from the ambient atmosphere.

For ingots consisting of gold and a single said metal, the upper limits for the various metals are: 10 atomic percent titanium; 8.8 atomic percent scandium; 8.0 atomic percent zirconium; 7.7 atomic percent lutetium and 5 atomic percent hafnium.

In a preferred method according to the invention the material resulting from the mechanical working step, has a maximum dimension in at least one direction of less than 50 $\mu$m.

In one particular method in accordance with the invention, after the heat treating below its solvus temperature step, the resulting material is provided with a coating of gold, silver, aluminium or copper or of an alloy or combination thereof, i.e. comprising layers of two or more of the metals.

The invention also provides an electrical conductor having a maximum dimension in at least one direction not greater than 250 $\mu$m and consisting at least partly of a precipitation hardened alloy of gold.

In such a conductor said alloy is preferably an alloy of gold and one or more of the metals titanium, lutetium, zirconium, scandium and hafnium. The conductor is then suitably made by a method according to the invention.

One particular embodiment of an electrical conductor according to the invention comprises a central core of said precipitation hardened alloy provided with a coating of gold, silver, aluminium or copper, or an alloy or combination thereof.

Alloys of gold with titanium are already known for use in the jewellery and coinage industries (see EP-A1-0190648), such alloys exhibiting lustre, hue and wear resistance properties which are desirable in those industries. The present invention resides in the discovery that such alloy, and the other alloys lying in the ambit of the present invention, when appropriately treated exhibit properties, i.e. high tensile strength and resistance to elongation under load, and retention of such properties after heating at elevated temperatures, which make them very suitable for use as fine wire or thin strip or sheet electrical conductors in electronic circuits and for other electrical applications.

DETAILED DESCRIPTION OF THE PREFERRED EMBODIMENT

The invention will now be further explained and various examples of methods of making electrical conductors according to the invention described.

One significant feature of the gold alloys used in methods according to the present invention is that they possess precipitation hardening characteristics. Hence, in a method according to the invention the lower limit of the range of alloying metal in the gold alloy used is defined by the maximum solid solubility of the alloying metal in gold at room temperature, i.e. the lower limit is the minimum atomic percentage (substantially 0.1 at%) required to form a precipitate phase.

Similarly the upper limit of the range of alloying metal is the atomic percentage corresponding to the maximum solubility of the alloying metal in gold, more particularly at the temperature of fusion of the saturated alloy, i.e. the temperature of the eutectic or peritectic reaction between gold and the alloying metal.

In practice the useful composition range is likely to be more restricted. Thus, the minimum useful concentration of alloying metal is determined by the minimum addition to gold that generates a significant strengthening effect. This generally means that the minimum level of the addition should be approximately five times the metallurgical minimum, e.g. for Au-Ti, the Ti concentration should be at least 0.5 at% (rather than 0.1 at%). The same is true for the other alloying metals.

The upper practical limit is defined by the introduction of oxides and other non-metals with the alloying metal that impair the workability of the alloy down to a fine wire or thin strip or sheet. The upper limit of additive concentration according to this criterion is typically a half of the metallurgical maximum concentration e.g. for titanium, the upper practical limit is 5.0 at% i.e. one half of the 10 at% maximum solubility limit of titanium in gold.

The desired precipitation hardening characteristics are best obtained with the following combination of properties:

(a) The alloying metal has a high solid solubility in gold at elevated temperatures and a relatively low solid solubility at room temperature. The greater is this solubility difference the larger will be the fraction of the precipitate phase that can form on cooling. The degree of strengthening that can be obtained by precipitation hardening will thereby be correspondingly greater.

(b) A large proportion of the alloying metal is retained in super-saturated solid solution on quenching from an elevated temperature solution treatment. This ensures a large volume fraction of precipitate generated in a subsequent heat treatment, and thereby a high strengthening effect.

(c) The precipitate phase is a stable intermetallic compound and is harder than the gold-rich matrix phase. This compound has as high an atomic proportion of gold as possible, so that its volume fraction can be high in relation to the amount of alloying metal added in relation to the amount of alloying metal added and the degree of strengthening be made all the greater.

A second significant feature of the gold alloys used in methods according to the present invention is that the alloying metal has a high reactivity with the oxygen and/or nitrogen in the ambient atmosphere. The precipitate phase can then be made to react with the ambient atmosphere to form a reaction product that is stable against further heat treatment.

On the basis of these criteria the favourable precipitation hardening characteristics of the alloys used in methods according to the invention can be seen from the following Table.

TABLE 1

| Alloying element | Maximum solubility at % | °C. | Solubility at 20° C. at % | Precipitate compound formed |
|---|---|---|---|---|
| Ti | 10.0 | 1115 | 0.2 | $Au_6Ti$ |
| Sc | 8.8 | 808 | 0.2 | $Au_4Sc$ |
| Zr | 8.0 | 1040 | 0.2 | $Au_3Zr$ |
| Lu | 7.7 | 890 | 0.2 | $Au_4Lu$ |
| Hf | 5.0 | 1064 | 0.2 | $Au_5Hf$ |

Of the alloys listed, gold-titanium best meets the combination of properties (a) to (c) above. The others also provide a significant degree of precipitation, but not to the same extent.

By appropriate thermal treatment below the solvus temperature, more particularly between 100° C. and 500° C., when in a sufficiently thin form, i.e. having a maximum dimension in at least one direction not greater than 250 μm, it is possible to boost the strength of these precipitation hardening alloys and their resistance to elongation under load, and/or to retain the precipitation strength at elevated temperatures for periods much longer than is normally possible with precipitation hardening alloys. The reason for this additional improvement appears to be that the reactive alloying metals combine with nitrogen and oxygen, e.g. in the atmosphere, as illustrated in Table II below, to form finely dispersed insoluble compounds which are then stable against further growth or dissolution.

There is a maximum dimension in a method of making a material according to the invention for which this strength boosting mechanism is effective because it requires reaction to occur between the reactive metal and the ambient atmosphere throughout a substantial proportion of the material. This maximum dimension is substantially 50 μm. No minimum dimension for this effect has been encountered. For material having a maximum dimension in at least one direction between 50 μm and 250 μm it is not possible to boost strength significantly, but only to stabilise the strengthening due to the precipitation process against further change.

The above factors are illustrated in Table II below which shows the strengthening produced in wires made by a method according to the invention from an ingot consisting of Au-1wt%Ti (Au-4at%Ti) subjected to heat treatment at 350° C. after drawing down from the ingot.

TABLE II

| Time at 350° C. hours | Tensile strength (MPa) conductor diameter (μm) | | | |
|---|---|---|---|---|
| | 25 | 55 | 200 | 1040 |
| 0 | 499 | 437 | 349 | 207 |
| 10 | 998 | 464 | 470 | 565 |
| 100 | 1438 | 491 | 485 | 470 |
| 1000 | 1038 | 474 | 472 | 366 |

It will be seen that the wire of diameter 25 μm exhibits boosted, stable strength whilst the wires of diameter 55 μm exhibits 200 μm exhibit stable precipitation strength only, and the wire of diameter 1040 μm exhibits only conventional unstable precipitation strength.

Of the metals that can be used to precipitation harden gold alloy, titanium is the least reactive towards oxygen and also towards nitrogen. As a general rule, the reactivity of a metal with oxygen increases with the enthalpy of formation of its oxide and Table III below therefore indicates the relative tendency of the precipitation hardened alloys to form stable precipitates.

TABLE III

| Oxide | Enthalpy of formation | |
|---|---|---|
| | $-\Delta H(298)$ KJ | Per mole of oxygen, KJ |
| $TiO_2$ | 944 | 944 |
| $ZrO_2$ | 1086 | 1086 |
| $HfO_2$ | 1113 | 1113 |
| $Sc_2O_3$ | 1906 | 1270 |
| $Lu_2O_3$ | 1906 | 1270 |

It is apparent from Table III that the other alloying metals are at least as effective in regard to this property as titanium and that suitably heat-treated fine wires, strips or sheets of gold alloyed with the other metals also have an enhanced strength and resistance to thermal ageing.

One method of making material in accordance with the invention will now be described by way of example.

The material is fine wire suitable for use as bond-wires in integrated circuits.

As a first step in the method measured quantities of gold and titanium in the proportion Au-1wt%Ti (Au-4at%Ti) are heated together in known manner to form a molten alloy i.e. at a temperature above 1063° C. The molten alloy is then poured into a mould and cooled to form an ingot.

The ingot is then subjected to a heat treatment for at least one hour, typically for one hour at a temperature above 950° C., e.g. to form a solid solution of titanium in gold. The ingot is then quench cooled in water from the solution heat treatment temperature.

The ingot is then drawn-down in known manner to a fine wire, typically of diameter 25 μm.

The wire is then heat treated at a temperature of 350° C. in air for a suitable period, as further explained below, to boost the strength of the wire, increase its resistance to elongation, and enable it to retain these properties at elevated temperatures for long periods, by the mechanism described above.

The tensile strength and elongation to failure of the wire after heat treatment for various lengths of time at 350° C. are given in Table IV below, together with comparable data for pure gold wire. The initial condition of the wire is unannealed, hard drawn.

TABLE IV

| Time at 350° C. (hrs) | Tensile Strength (grams) | | Elongation to Failure (%) | |
|---|---|---|---|---|
| | Au | Au-1 wt % Ti | Au | Au-1 wt % Ti |
| 0 | 12 | 25 | 2 | 2 |
| 0.16 | 2 | 28 | 10 | 3 |
| 1 | 1 | 30 | 20 | 3 |
| 50 | 1 | 67 | 40 | 3 |
| 100 | 1 | 72 | 20 | 4 |
| 500 | 1 | 62 | 10 | 4 |
| 1000 | 1 | 55 | 10 | 5 |
| 5000 | 1 | 61 | 10 | 5 |

Tensile strength is expressed as the load in grams required to cause the wire to fail. Elongation to failure was tested using a 25 mm length of wire.

It will be seen from Table IV that the Au-Ti fine wire has a tensile strength which is initially about twice that of pure gold wire and which actually increases after exposure to elevated temperature for prolonged periods, rather than markedly decreasing as is the case for pure gold wire. At the same time the elongation of the Au-Ti wire, which is initially the same as for pure gold wire, increases only slightly on exposure to elevated temperature, whereas the elongation of pure gold wire increases up to twenty times on comparable exposure.

It will be appreciated that these properties of the strengthened wire render it very much more resistant to deformation and breakage than pure gold wire on exposure to vibration, further thermal treatment and mechanical shock, and thus render them especially suitable for use as bond-wire in electrical circuits. It will be understood that low resistance to deformation of bond-wire can lead to wire sag and tab shorting, especially in ceramic encapsulated devices, and to moulding failure in plastic encapsulated devices.

A particular feature of Au-Ti alloy material made by a method according to the invention is that if it is heat treated to give desired elongation and strength properties, heat treatment beyond the minimum time required to give the minimum required elongation and strength properties can further increase rather than reduce elongation and strength. By comparison, pure gold material has its maximum strength in the as-drawn condition and heat treatment, e.g. to increase elongation, will invariably reduce strength.

It will be understood that other materials made by a method in accordance with the invention exhibit similar properties to the Au-Ti alloy material described by way of example in respect of increasing, or at least maintaining, their tensile strengths, and relatively small increase in elongation compared with pure gold material, on exposure to temperatures up to about 500° C.

Table V below compares the hardness of two 250 μm diameter wires made by a method according to the invention of composition Au-1wt%Ti and Au-1wt%Zr using various periods of heat treatment at 520° C.

TABLE V

| Time at 500° C. (hours) | Hardness (Hv) | |
|---|---|---|
| | Au-1 wt % Ti | Au-1 wt % Zr |
| 0 | 62 | 63 |
| 2 | 170 | 174 |
| 4 | 162 | 171 |
| 6 | 158 | 169 |
| 8 | 156 | 166 |
| 10 | 154 | 160 |
| 100 | 130 | 146 |
| 1000 | 116 | 131 |

Materials made by a method in accordance with the invention exhibit the ability to be satisfactorily bonded to members of aluminium, gold and aluminium and gold based materials using conventional ultrasonic bonding techniques.

Such bonds exhibit increased strength compared with bonds between pure gold and aluminium. However for use in such techniques material made by a method according to the invention is preferably first provided by conventional methods with a thick coating of pure gold, silver, aluminium or copper, or an alloy of these metals, or comprising layers of two or more of these metals. The coating thickness may be required to be comparable with or greater than the diameter of the gold alloy material in order to obtain a satisfactory ball prior to bonding. A coating of such thickness prevents the formation of oxides of the reactive metal component of the gold alloy material that impair ball formation.

Materials made by a method according to the invention may also be provided with a coating of a plastics material, if desired, without significantly affecting their desirable properties.

It will be appreciated that the final heat treatment step of the method according to the invention should be carried out before the application of the above-described coatings.

Materials made by a method according to the invention by and large show improved resistance to aggressive corrosive environments compared with known gold, aluminium, gold based and aluminium based materials. For example, Au-1wt%Ti has one tenth of the dissolution rate of pure gold in aqua regia. This is of considerable importance in the case of bond-wires in plastic encapsulation devices, i.e. bond-wires in electronic circuits encapsulated in plastics material, since in such devices acidic vapours are frequently produced in the region of bond-wires that can cause corrosion fatigue in known bond-wires.

It will be understood that whilst in the case of material in the form of a fine wire made by a method in accordance with the invention the mechanically working step will comprise, at least in the latter stages, a drawing process, in other methods in accordance with the invention the mechanical working step may comprise rolling or other working processes.

A further feature of a method according to the invention is that fewer processing stages are required to reduce an ingot of given size to wire, sheet or strip material of desired dimensions than are required with gold and gold based materials. This is due to the greater tensile strength of the gold alloys used in methods according to the invention together with a ductility at least comparable to gold and gold-based alloys. By way of example of this feature it is found that the reduction of a 1 mm diameter wire of pure gold to 25μm diameter by wire drawing typically requires about 100 stages whereas a Au-1wt%Ti wire of 1 mm diameter can be reduced to 25μm during a method according to the invention in less than 50 stages. This represents an elongation of length of more than 7% per stage. It will be understood that material made by a method in accordance with the invention may, if desired, include small amounts of additive other than one or more of the metals titanium, lutetium, zirconium, scandium and hafnium For example a wire made by a method in accordance with the invention may for example include an amount less than 0.05 wt% or iron to confer upon it thermoelectric characteristics so that it may be used as thermocouple wire.

We claim:

1. A method of making material in the form of a fine wire or thin strip or sheet suitable for use as electrical conductors comprising the steps of forming an ingot substantially consisting of an alloy of gold and at least one of the metals titanium, lutetium, zirconium, scandium and hafnium, the amount of each of said at least one of the metals in the alloy lying in the range from substantially 0.1 at% to an upper limit comprising the atomic percentage of that metal corresponding to the maximum solubility of that metal in the alloy; solution heat treating the ingot and then quenching the ingot from the solution heat treatment temperature; mechanically working the ingot to have a maximum dimension in at least one direction not greater than 250 μm; and heat treating the resulting material at a temperature below its solvus temperature in an ambient atmosphere containing at least one of oxygen and nitrogen to produce a reaction produce precipitate with at least one of oxygen and nitrogen from the ambient atmosphere.

2. A method according to claim 1 wherein the atomic percentage of titanium in the alloy is in the range 0.5% to 5.0%.

3. A method according to claim 1 wherein the atomic percentage of lutetium is in the range 0.5% to 3.85%.

4. A method according to claim 1 wherein the atomic percentage of zirconium is in the range of 0.5% to 4.0%.

5. A method according to claim 1 wherein the atomic percentage of scandium is in the range 0.5% to 4.4%.

6. A method according to claim 1 wherein the atomic percentage of hafnium is in the range 0.5% to 2.5%.

7. A method according to claim 1 wherein the material resulting from the mechanical working step has a maximum dimension in at least one direction of less than 50 μm.

8. A method according to claim 1 wherein said heat treating at a temperature below its solvus temperature is carried out at a temperature in the range 100° to 500° C.

9. A method according to claim 8 wherein said heat treating at a temperature below its solvus temperature is carried at a temperature of substantially 350° C.

10. A method according to claim 1 wherein, after the heat treating at a temperature below its solvus temperature step, the resulting material is provided with a coating of at least one of gold, silver, aluminium and copper.

11. A method according to claim 10 wherein said coating has a thickness not substantially less than the dimension of said resulting material in said at least one direction.

* * * * *